United States Patent
Zhu et al.

(10) Patent No.: US 9,406,439 B2
(45) Date of Patent: Aug. 2, 2016

(54) PROCESS FOR FORMING A CERAMIC OXIDE MATERIAL WITH A PYROCHLORE STRUCTURE HAVING A HIGH DIELECTRIC CONSTANT AND IMPLEMENTATION OF THIS PROCESS FOR APPLICATIONS IN MICROELECTRONICS

(75) Inventors: Xiaohong Zhu, Chengdu (CN); Emmanuel Defay, Voreppe (FR); Eric Fribourg-Blanc, Brunoy (FR)

(73) Assignee: COMMISSARIAT A L'ENERGIE ATOMIQUE, Paris (FR)

( * ) Notice: Subject to any disclaimer, the term of this patent is extended or adjusted under 35 U.S.C. 154(b) by 1008 days.

(21) Appl. No.: 12/564,854

(22) Filed: Sep. 22, 2009

(65) Prior Publication Data
US 2010/0072057 A1 Mar. 25, 2010

(30) Foreign Application Priority Data
Sep. 23, 2008 (FR) ...................... 08 56386

(51) Int. Cl.
C23C 14/24 (2006.01)
H01G 4/12 (2006.01)
C23C 14/08 (2006.01)
C23C 14/56 (2006.01)
C23C 14/58 (2006.01)

(52) U.S. Cl.
CPC ............ *H01G 4/12* (2013.01); *C23C 14/088* (2013.01); *C23C 14/56* (2013.01); *C23C 14/584* (2013.01); *C23C 14/5806* (2013.01)

(58) Field of Classification Search
CPC C23C 14/5806; C23C 14/584; C23C 14/086; C23C 14/088; C23C 16/56
USPC .............. 204/192.12, 192.15, 192.29, 192.17
See application file for complete search history.

(56) References Cited

U.S. PATENT DOCUMENTS

| | | | |
|---|---|---|---|
| 4,637,989 A | 1/1987 | Ling et al. | |
| 4,888,246 A * | 12/1989 | Kuwata et al. | 428/432 |
| 6,103,072 A * | 8/2000 | Nishiwaki et al. | 204/192.18 |
| 6,432,725 B1 | 8/2002 | Lian et al. | |
| 6,482,527 B1 | 11/2002 | Shrout et al. | |
| 6,495,878 B1 | 12/2002 | Hayashi et al. | |
| 2003/0136998 A1 | 7/2003 | Baniecki et al. | |
| 2003/0161959 A1 | 8/2003 | Kodas et al. | |
| 2003/0184952 A1 | 10/2003 | Baniecki et al. | |
| 2005/0098816 A1 | 5/2005 | Baniecki et al. | |
| 2006/0234395 A1* | 10/2006 | Kijima | 438/3 |

OTHER PUBLICATIONS

Search Report issued by the French Patent Office on May 4, 2009.

* cited by examiner

*Primary Examiner* — Jason M Berman
(74) *Attorney, Agent, or Firm* — Nixon Peabody LLP; Khaled Shami

(57) ABSTRACT

The invention relates to a process for forming a lead-based ceramic oxide dielectric material comprising at least one pyrochlore crystalline phase, which process comprises the following steps: a) a step of depositing at least one amorphous layer of said lead-based ceramic oxide material on a substrate; and b) a crystallization annealing step carried out on said amorphous layer at a temperature not exceeding 550° C., by means of which a lead-based ceramic oxide dielectric material comprising at least one pyrochlore phase is obtained. Application to the fabrication of capacitors on integrated circuits.

15 Claims, 3 Drawing Sheets

PROCESS FOR FORMING A CERAMIC OXIDE MATERIAL WITH A PYROCHLORE STRUCTURE HAVING A HIGH DIELECTRIC CONSTANT AND IMPLEMENTATION OF THIS PROCESS FOR APPLICATIONS IN MICROELECTRONICS

CROSS REFERENCE TO RELATED APPLICATIONS OR PRIORITY CLAIM

This application claims priority of French Patent Application No. 08 56386, filed Sep. 23, 2008.

TECHNICAL FIELD

The present invention relates to a process for forming a lead-based ceramic oxide material with a pyrochlore structure, this material advantageously having a dielectric loss $\leq 0.015$ and a dielectric constant $\geq 40$.

This process is applicable, in particular, in the fabrication of passive components, especially in the design of capacitors comprising a dielectric part capable of storing a large amount of electric charge per unit area, it being possible for these components to be placed on the surface of integrated circuits, thus corresponding to the "above IC" approach). This process is also applicable in the fabrication of "stand-alone" components (i.e. corresponding to components produced on a substrate independent of that of the integrated circuits with which they are associated).

PRIOR ART

In microelectronics, there is a current need to miniaturize electronic devices and especially the dielectric parts thereof, while still maintaining their electrical properties.

The electrical properties of a dielectric material may be expressed by the following quantities:

the relative dielectric constant of the dielectric material (conventionally represented by $\in_r$), which expresses as it were the insulating character of the materials;

the dielectric dissipation factor (conventionally represented by tan $\delta$), which, for an insulating material subjected to a sinusoidal voltage, expresses the ratio of the active power absorbed to the absolute value of the reactive power; and the dielectric quality factor, corresponding to the inverse of the dielectric dissipation factor.

For capacitive devices designed to be included in integrated circuits, the dielectric constant must ideally be high (for example, at least equal to 40) and the dissipation factor must be low (for example, less than 2%), these properties necessarily deriving from the nature of the dielectric materials used.

The dielectric material most commonly used at the present time in integrated circuits is silicon dioxide, $SiO_2$. However, this dielectric material has a number of drawbacks, among which that may be mentioned is a low dielectric constant of around 3.9. To obtain capacitance values necessary for circuits to operate correctly, capacitors using silicon dioxide as dielectric material must, in order to compensate for the relatively low dielectric constant, have a very large area and indeed a very small thickness, this being incompatible with the wish to obtain a high density of capacitive components in integrated circuits. What is more, by reducing the thickness of the $SiO_2$ layers, high tunnel currents may appear, these being prejudicial to correct operation of the integrated circuits in which the capacitors are included. Dielectric materials having a higher dielectric constant than silicon oxide $SiO_2$ must therefore be developed.

Thus, some authors have used other dielectric materials, such as ceramic oxide materials that have crystallized in the perovskite system, such as lead zirconium titanate materials (known as PZT materials).

These materials have, advantageously, a very high dielectric constant (of the order of 1000) but, however, a dielectric loss that is also high (around 0.02-0.05), which may prove to be problematic in certain microelectronic applications.

Certain authors have also produced ceramic oxide materials crystallized in a pyrochlore system, such as materials having the following compositions: $(Bi_{3x}Zn_{2-3x})(Zn_xNb_{2-x})O_7$ (as described in U.S. Pat. No. 6,482,527) and $(Ba_xSr_{1-x})_2(Ta_yNb_{1-y})_2O_7$ (as described in U.S. Pat. No. 6,495,878). However, the formation of such materials requires working at temperatures often above 550° C. Such temperatures may be deleterious, especially when the materials are intended to be produced on integrated circuits, such temperature levels possibly degrading the surrounding components and the interconnects.

There is therefore a real need for a process for forming ceramic oxide materials that can act as dielectric materials in electronic components such as capacitors incorporated into integrated circuits, this process not having to require the use of temperatures liable to degrade surrounding components and furthermore having to allow dielectric materials to be obtained which have, at the very least, a high dielectric constant and a low dielectric dissipation factor.

SUMMARY OF THE INVENTION

Thus, the present inventors have discovered, surprisingly, that by working within a certain annealing temperature range, starting from a particular base material, it is possible to obtain materials that crystallize in the pyrochlore system and have particularly advantageous dielectric properties, such as a high dielectric constant and a low thermal dissipation factor.

Thus, the subject of the invention is a process for forming a lead-based ceramic oxide dielectric material comprising at least one pyrochlore crystalline phase, which process comprises the following steps:

a) a step of depositing at least one amorphous layer of said lead-based ceramic oxide material on a substrate; and b) a crystallization annealing step carried out on said amorphous layer at a temperature not exceeding 550° C., by means of which a lead-based ceramic oxide dielectric material comprising at least one pyrochlore phase is obtained.

Advantageously, the crystallization annealing is carried out on said amorphous layer at a temperature not exceeding 450° C., preferably ranging from 400 to 450° C.

Steps a) and b) mentioned above may be carried out in succession or simultaneously.

Thus, the inventors have discovered, surprisingly, that by applying a crystallization annealing step at a temperature not exceeding 550° C. to a lead-based amorphous ceramic oxide material, it is possible to crystallize all or part of said material in a pyrochlore system and, furthermore, obtain dielectric properties of this material which are particularly advantageous, namely a high dielectric constant, advantageously greater than 40, and a low dielectric dissipation factor, advantageously less than 0.015 and a dielectric strength advantageously equal to or greater than 800 kV/cm.

It should be noted that the term "pyrochlore system" is understood in general to mean a crystalline structure of the $A_2B_2O_6$ or $A_2B_2O_7$ type, with A being lead and B possibly being Nb, Mg, Ti and mixtures thereof, this system being characterized in particular by the presence in X-ray diffraction patterns of peaks P1 and P2 as shown, for one particular case, in FIG. 2.

Ceramic oxide materials comprising at least one pyrochlore crystalline phase that can be produced according to the process of the invention may be lead niobate (PN) layers, lead magnesium niobate (PMN) layers and layers of a solid solution resulting from a mixture of lead magnesium niobate and lead titanate (PMNT) layers. In particular, the ceramic oxide layer having a pyrochlore structure prepared by the process of the invention may be a PMNT layer satisfying the following nominal composition:

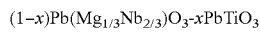

$$(1-x)Pb(Mg_{1/3}Nb_{2/3})O_3\text{-}xPbTiO_3$$

x ranging from 0 to 1, 1 not being inclusive; in particular, x may be equal to 0.1.

Step a) of depositing the layer of amorphous ceramic oxide material on the abovementioned substrate may be carried out by a technique chosen from:
  physical vapour deposition (PVD) techniques;
  chemical vapour deposition (CVD) techniques; and
  solution deposition techniques.

Physical vapour depositions may be subdivided into two subgroups:
  vacuum evaporation deposition PVD techniques; and
  sputtering deposition PVD techniques.

In vacuum evaporation deposition techniques, the material intended to be deposited is heated in a vacuum. The atoms of the material to be evaporated receive sufficient thermal energy to exceed the bonding energy of these atoms and result in evaporation. The atoms of the material in the vapour state then condense on the substrate to be coated. Various methods of heating the material may be envisaged, among which mention may be made of electron bombardment heating, resistance heating, electric arc heating, induction heating, ion beam heating and laser ablation heating (the deposition in the latter case then being known as PLD).

Sputtering deposition techniques consist in ejecting particles from the surface of the material to be deposited (called the target) by bombarding this surface with energetic particles (the vapour thus being created by a mechanical effect) such as argon ions, said particles possibly coming either from a plasma or from an ion source. In particular, mention may be made of ion beam sputtering or IBS.

Advantageously, the deposition technique of the invention may be carried out by a particular sputtering deposition technique, namely magnetron sputtering.

Magnetron sputtering conventionally consists in providing the target with a magnetron device consisting of two concentric magnets of reverse polarities. A pole piece closes the magnetic circuit on one side, whereas the target, which is non-magnetic so as to produce the magnetron effect, letting the field lines complete the circuit within the gas phase, this having the effect of trapping the secondary electrons and thus increasing the possibility of them encountering a plasma gas atom (such as an argon atom) in the case of ionizing interaction. A dense plasma is then generated right in the gap between the magnets, this plasma, on coming into contact with the target, eroding the latter and converting the material of the target into particles that can be deposited on the substrate.

Advantageously, when employing this technique, the substrate is not subjected to a heating step, apart from the heating that results from the ion bombardment stemming from the magnetron sputtering.

To give an example using this type of technique, the target may be a ceramic of nominal composition $0.9Pb(Mg_{1/3}Nb_{2/3})O_3\text{-}0.1PbTiO_3$ and the plasma gas used may be argon.

CVD techniques consist in depositing, on the surface of the substrate, a material that passes from the gaseous state to the solid state when a chemical reaction takes place between the contacting components. The compounds, by reacting together to form the ceramic oxide to be deposited, may be metal chlorides or organometallic compounds in the presence of a gas, such as hydrogen and carbon dioxide.

When the technique involves organometallic compounds, it is conventionally called MOCVD (metal organic chemical vapour deposition).

Finally, solution deposition techniques include the sol-gel technique, which consists in preparing the oxide by mixing metal precursors in solution, followed by a step of depositing said solution on a substrate.

In particular, when the ceramic oxide to be formed corresponds to one of the PMNT type, as mentioned above, a solution may be formed from the following precursors: lead acetate trihydrate, magnesium acetate, niobium ethoxide and titanium isopropoxide. More precisely, the formation of this solution firstly comprises mixing lead acetate and magnesium acetate with 2-methoxyethanol, the mixture then being heated at reflux for one hour at 100° C. The residual water, coming in particular from the lead acetate precursor, is then removed by distillation at 125° C. After cooling to room temperature, the titanium isopropoxide and the niobium ethoxide are added to the solution under a stream of argon. The concentration of the resulting solution may be adjusted either by adding more solvent (to reduce said concentration) or by distilling some of the solvent (to increase said concentration). What is thus obtained is a solution called a "mother liquor" (also called a "stock solution").

The sol-gel solution obtained may then be deposited by the following techniques:
  dip-coating;
  spin-coating;
  laminar-flow-coating or meniscus coating;
  spray-coating;
  soak coating;
  roll coating or roll-to-roll coating;
  brush coating; and
  screen printing.

Advantageously, the sol-gel solution is deposited by spin coating, thereby allowing the thickness of the deposited layer to be precisely controlled.

Independently of the way in which the deposition step may be carried out, the substrate may be entirely or partly electrically conductive, for example made of a metal (a substrate comprising platinum or ruthenium for example). It may also be made of a material chosen from silicon, which may possibly be oxidized, sapphire, a semiconductor material having electrically conductive interconnects, an electrically conductive ceramic or a dielectric. The substrate may be electrically insulating.

Once the deposition step has been carried out, a crystallization annealing step is carried out on the layer deposited beforehand by heating it to a temperature not exceeding 550° C., advantageously a temperature ranging from 400 to 450° C., after which the layer comprises, at least in part, a pyrochlore crystalline phase.

After the process, a lead-based ceramic oxide material comprising at least one pyrochlore crystalline phase is thus obtained in the form of a film, which may have a thickness ranging from 0.01 to 1 μm, for example ranging from 40 to 110 nm, and having at least one of the following electrical properties:

a relative dielectric constant of 40 or higher; and
a dielectric dissipation factor of 0.015 or lower.

Because the crystallization annealing step is carried out at a temperature not exceeding 550° C., it is possible to use this process for producing capacitors intended in particular for the fabrication of integrated circuits, for example CMOS circuits, these CMOS circuits imposing a maximum fabrication temperature of 550° C. or even 450° C., so as to preserve the integrity of the metal interconnects. The process of the invention is therefore particularly advantageous in what is called the "above IC" approach, as already defined previously.

It is possible to use this process for fabricating stand-alone components, which are circuits for which there are no underlying integrated circuits. Thus, the fabrication of integrated circuits and passive components is carried out on two separate substrates. There is therefore no thermal limitation due to the integrated circuits for fabricating passive components.

Thus, another subject of the invention is a process for forming a capacitor, in particular a capacitor placed above an integrated circuit, comprising:

a step of implementing the process as defined above, the substrate being electrically conductive at least in its upper part in contact with the layer of oxide material, which part thus constitutes the lower electrode, the layer of oxide material comprising at least one pyrochlore crystalline phase constituting the dielectric region; and a step of depositing an electrically conductive layer, for example made of a metal such as platinum, on the face of the layer of oxide material on the opposite side from the face in contact with the substrate, so as to constitute the upper electrode.

In this situation, the substrate, in its upper part, will advantageously be made of a metal such as platinum, so as to constitute the lower electrode.

Such a capacitor, shown in FIG. 5, comprises:

a substrate 13, the upper part 15 of which is electrically conductive, thus forming the lower electrode of the capacitor;

a layer of oxide material 17 having a pyrochlore phase obtained according to the process of the invention; and an electrically conductive layer 19 deposited on said layer of oxide material, thus forming the upper electrode of the capacitor.

According to another embodiment, the subject of the invention is also a process for forming a capacitor, in particular a capacitor placed above an integrated circuit, comprising:

a step of implementing the process as defined above, the substrate being electrically insulating at least in its upper part in contact with the layer of oxide material, the layer of oxide material comprising at least one pyrochlore crystalline phase constituting the dielectric region; and a step of depositing two separate electrically conductive layers, for example made of a metal such as platinum, on the face of the layer of oxide material on the opposite side from the face in contact with the substrate, so as to form two separate electrodes, which will constitute the two electrodes of opposite polarities during operation of the capacitor.

Such a capacitor, shown in FIG. 6, comprises:

a substrate 21;

a layer of oxide material 23 having a pyrochlore phase, obtained according to the process of the invention; and two separate electrically conductive layers 25, 27 deposited on said oxide material, thus forming two separate electrodes.

The capacitors obtained are capacitors of the metal-insulator-metal type and may be used at low frequency or in the radiofrequency range.

Within the context of fabricating a capacitor, the electrically conductive substrate defined above may be deposited before hand on a multilayer stack comprising, in succession, a layer of silicon, a layer of silica $SiO_2$ and a layer of titanium or titanium dioxide, this layer serving as tie layer for the electrically conductive substrate on the silica. The silica layer itself constitutes a conventional diffusion barrier between the overlying layers and the silicon.

The invention will now be described in greater detail with regard to the following examples given below by way of non-limiting illustration.

DETAILED DESCRIPTION OF PARTICULAR EMBODIMENTS

Example

Figure 1:
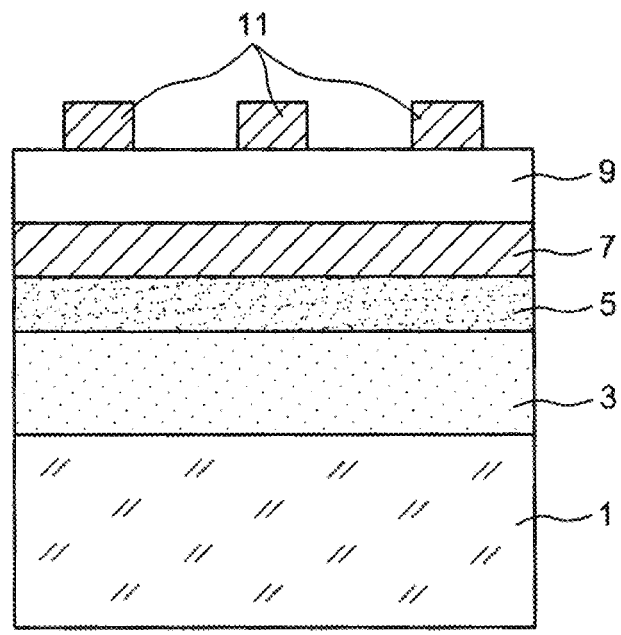
FIG. 1 shows a cross-sectional view of a capacitor fabricated in accordance with the process of the invention.

Deposited on a multilayer stack comprising, as illustrated in FIG. 1:

a silicon wafer 1;
an $SiO_2$ silica layer 3 about 0.5 μm in thickness;
a titanium dioxide $TiO_2$ layer 5 about 20 nm in thickness; and
a platinum Pt layer 7 about 100 nm in thickness, was an amorphous ceramic oxide layer 9 having the nominal composition $0.9Pb(Mg_{1/3}Nb_{2/3})O_3$-$0.1PbTiO_3$ 9 (the sputtering target having been purchased from the supplier Super Conductor Materials, Inc., USA) with 15% excess MgO by magnetron sputtering with argon as plasma gas.

The resulting multilayer stack was then heated at various annealing temperatures, stretching from room temperature, 300, 350, 400, 450° C., 500 and 550° C., in a conventional air oven.

The ceramic oxide layer had a thickness of about 50 nm.

To determine the electrical and dielectric properties of the ceramic oxide layer deposited, circular platinum electrodes 11 with a diameter of 110 µm were deposited on the surface of said layer by a method combining both DC sputtering and lithography.

The dielectric and electrical properties were measured at room temperature using an Agilent B1500A analyzer and an HP 4194 impedance analyzer.

Figure 2:
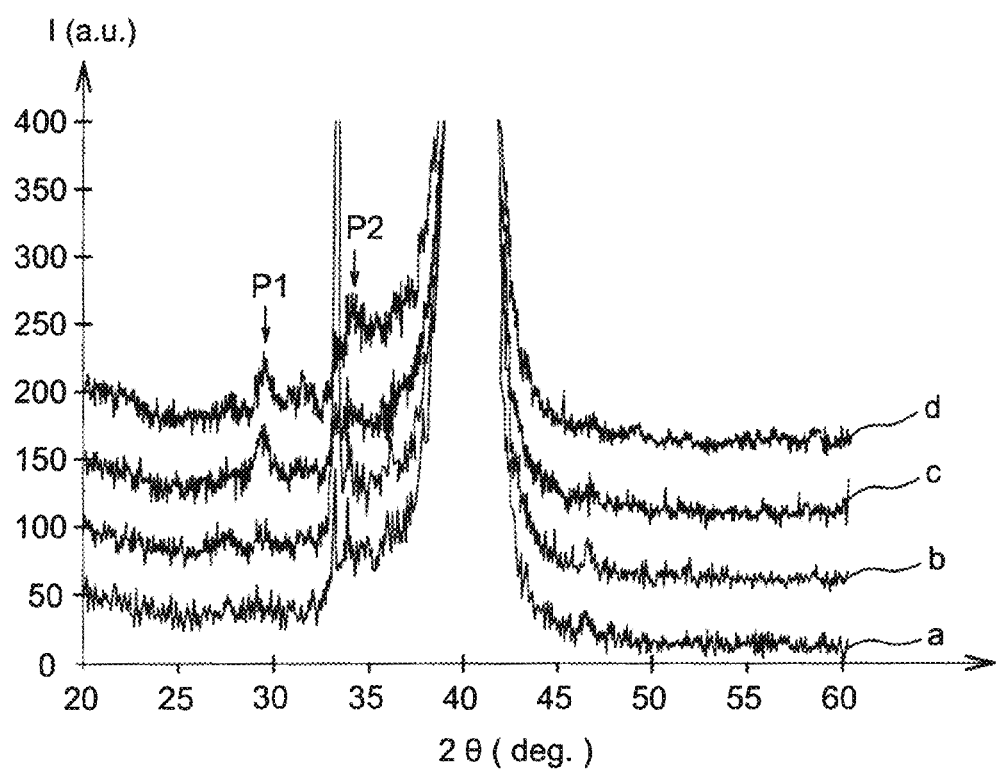
FIG. 2 is an X-ray diffraction pattern (Intensity I (in atomic units a.u. plotted as a function of the angle 2θ (in °)) of a layer of ceramic oxide material having the nominal composition $0.9Pb(Mg_{1/3}Nb_{2/3})O_3$-$0.1PbTiO_3$ obtained according to the protocol described in the example below (curves a, b, c and d correspond to respective annealing temperatures of 400, 450, 500 and 550° C.).

FIG. 2 shows an x-ray diffraction pattern of the ceramic oxide layer obtained with crystallization annealing temperatures of 400, 450, 500 and 550° C. (curves a, b, c and d) respectively, these curves showing the presence of a pyrochlore phase for such annealing temperatures (peaks P1 and P2 in FIG. 2), the proportion of pyrochlore phase being higher for an annealing temperature of 450° C.

Figure 3:
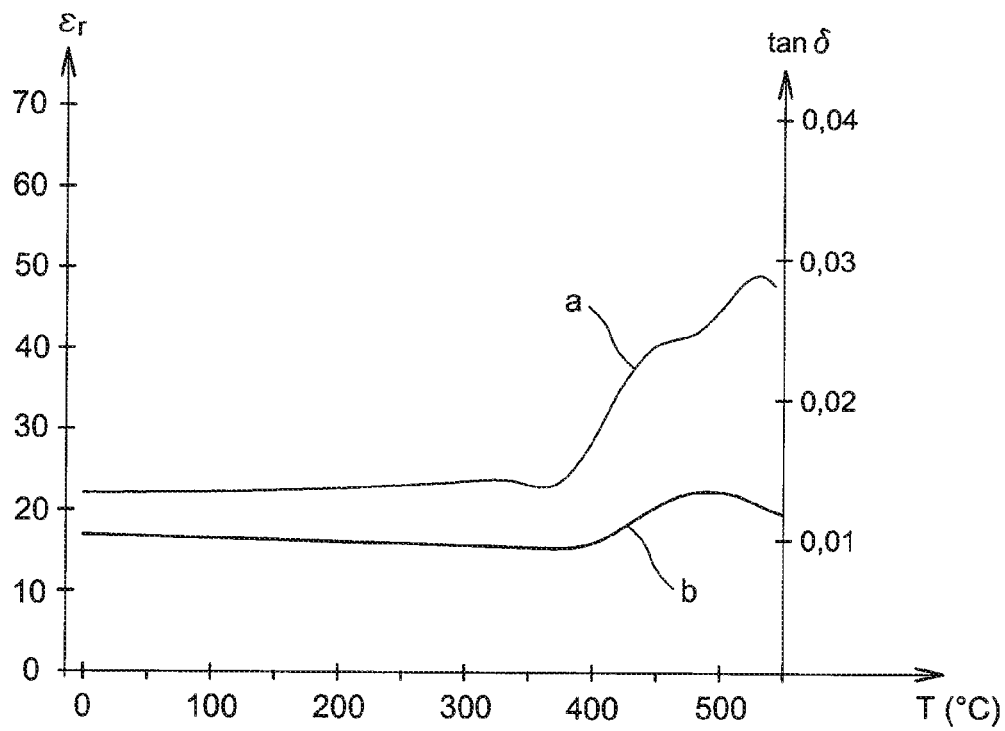
FIG. 3 is a graph illustrating the variation in the relative dielectric constant $\in_r$ and the dielectric dissipation factor tan δ for a layer of ceramic oxide material having the nominal composition $0.9Pb(Mg_{1/3}Nb_{2/3})O_3$-$0.1PbTiO_3$ obtained in accordance with the protocol described in the example below at various annealing temperatures T (in ° C.) (room temperature, 300, 350, 400, 450, 500 and 550° C.).

The relative dielectric constant $\in_r$ (curve a) and the dielectric dissipation factor tan δ (curve b) were then measured, at a frequency of 10 kHz, on a ceramic oxide layer as formed above for various annealing temperatures (room temperature, 300° C., 350° C. 400° C., 450° C., 500 and 550° C.). The measurement values being plotted in FIG. 3.

This figure shows that, above 400° C., the relative dielectric constant (curve a) increases significantly.

Figure 4:
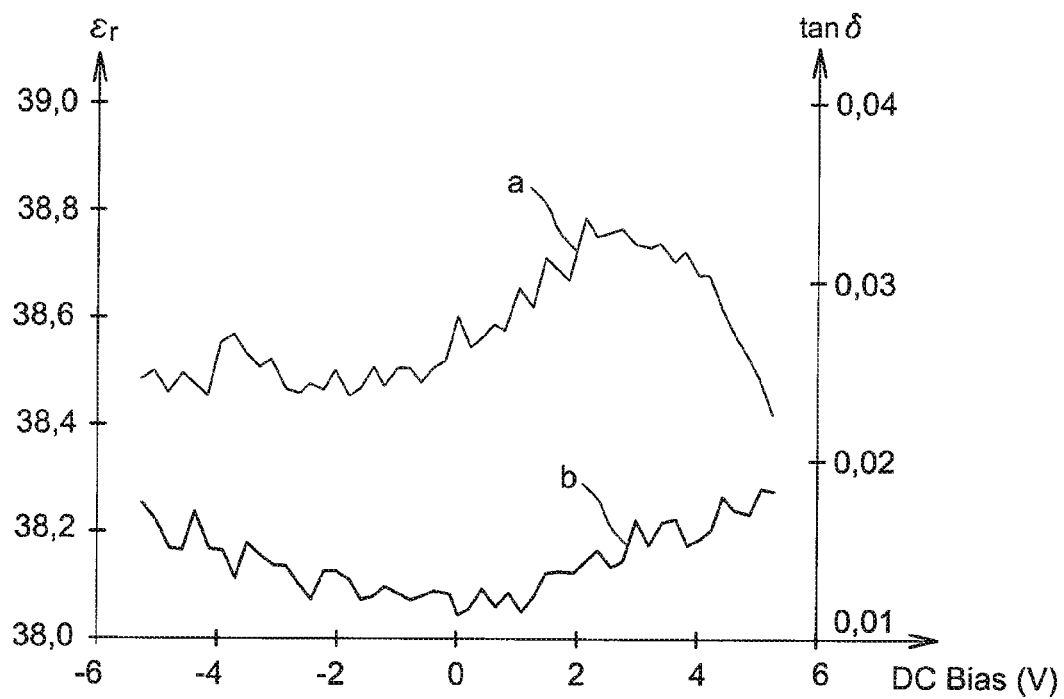
FIG. 4 is a graph illustrating the variation in the dielectric constant $\in_r$ and the dielectric dissipation factor tan δ for a layer of ceramic oxide material having the nominal composition $0.9Pb(Mg_{1/3}Nb_{2/3})O_3$-$0.1PbTiO_3$ annealed at a temperature of 450° C. obtained in accordance with the protocol described in the example below as a function of the DC bias (in V) (ranging from −6V to +6V).
Figure 5:
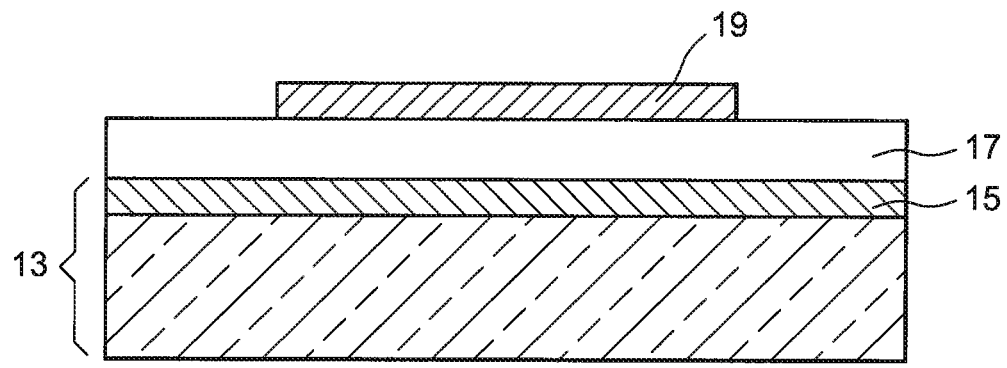
FIGS. 5 and 6 show cross-sectional views of two embodiments of a capacitor fabricated according to the method of the invention.
Figure 6:
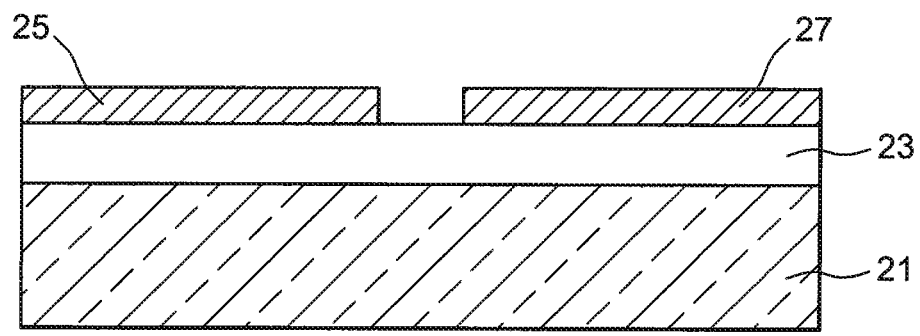

The dielectric constant and the dielectric dissipation factor were also measured on a ceramic oxide layer annealed at a temperature of 450° C., in accordance with what was described above, as a function of the DC bias voltage, these measurements being plotted in FIG. 4.

It may be seen that the relative dielectric constant increases over most of the bias voltage range (curve a), indicating a negative variation in capacitance as a function of the DC bias voltage.

As regards the dielectric dissipation factor, this remains at values below 0.02 over the entire bias voltage range (curve b).

The invention claimed is:

1. Process for forming a lead-based ceramic oxide dielectric material comprising at least one pyrochlore crystalline phase chosen from lead niobate, lead magnesium niobate and a solid solution resulting from a mixture of lead magnesium niobate and lead titanate, which process comprises the following steps:
   a) a step of depositing at least one amorphous layer of said lead-based ceramic oxide material on a substrate; and
   b) a crystallization annealing step carried out on said amorphous layer at a temperature less than 550° C., by means of which a lead-based ceramic oxide dielectric material comprising at least one pyrochlore phase is obtained.

2. Process according to claim 1, in which the lead-based ceramic oxide dielectric material is a solid solution resulting from a mixture of lead magnesium niobate and lead titanate, which may satisfy the following nominal composition:

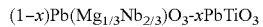

$(1-x)Pb(Mg_{1/3}Nb_{2/3})O_3\text{-}xPbTiO_3$ x ranging from 0 to 1, 1 not being inclusive.

3. Process according to claim 1, in which deposition step a) is carried out by a physical vapour deposition (PVD) step, a chemical vapour deposition (CVD) technique or a sol-gel deposition technique.

4. Process according to claim 3, in which the physical vapour deposition technique is a vacuum evaporation deposition or sputtering technique.

5. Process according to claim 1, in which deposition step a) is carried out by magnetron sputtering.

6. Process according to claim 1, in which all or part of the substrate is electrically conductive.

7. Process according to claim 6, in which the substrate comprises platinum or ruthenium.

8. Process according to claim 1, in which crystallisation annealing step b) is carried out at a temperature not exceeding 450° C.

9. Process according to claim 1, in which crystallisation annealing step b) is carried out at a temperature ranging from 400 to 450° C.

10. Process according to claim 1, in which step a) and step b) are carried out in succession or simultaneously.

11. Process according to claim 1, in which the lead-based ceramic oxide dielectric material comprising at least one pyrochlore crystalline phase takes the form of a film having a thickness ranging from 0.01 to 1 µm.

12. Process according to claim 1, in which the lead-based ceramic oxide dielectric material comprising at least one pyrochlore crystalline phase has at least one of the following electrical properties:
   a relative dielectric constant of 40 or higher; and
   a dielectric dissipation factor of 0.015 or lower.

13. Process for forming a capacitor placed on an integrated circuit comprising:
   a step of implementing the process as defined in claim 1, the substrate being electrically conductive at least in its upper part in contact with the layer of oxide material comprising at least one pyrochlore crystalline phase, which part thus constitutes the lower electrode, the layer of oxide material comprising at least one pyrochlore crystalline phase constituting the dielectric region; and
   a step of depositing an electrically conductive layer on the face of the layer of oxide material on the opposite side from the face in contact with the substrate, so as to constitute the upper electrode.

14. Process for forming a capacitor placed above an integrated circuit comprising:
   a step of implementing the process as defined in claim 1, the substrate being electrically insulating at least in its upper part in contact with the layer of oxide material, the layer of oxide material comprising at least one pyrochlore crystalline phase constituting the dielectric region; and
   a step of depositing two separate electrically conductive layers on the face of the layer of oxide material on the opposite side from the face in contact with the substrate, so as to form two separate electrodes.

15. Process according to claim 1, in which crystallisation annealing step b) is carried out at a temperature not exceeding 500° C.

* * * * *